US011252513B2

(12) United States Patent
Brioschi et al.

(10) Patent No.: US 11,252,513 B2
(45) Date of Patent: Feb. 15, 2022

(54) PACKAGING FOR A MEMS TRANSDUCER

(71) Applicant: Cirrus Logic International Semiconductor Ltd., Edinburgh (GB)

(72) Inventors: Roberto Brioschi, Austin, TX (US); Rkia Achehboune, Edinburgh (GB); David Patten, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/823,588

(22) Filed: Mar. 19, 2020

(65) Prior Publication Data

US 2020/0304921 A1 Sep. 24, 2020

Related U.S. Application Data

(60) Provisional application No. 62/822,183, filed on Mar. 22, 2019.

(30) Foreign Application Priority Data

Apr. 29, 2019 (GB) ..................... 1905929

(51) Int. Cl.
*H04R 19/00* (2006.01)
*H04R 19/04* (2006.01)
(Continued)

(52) U.S. Cl.
CPC .......... *H04R 19/04* (2013.01); *B81B 7/0061* (2013.01); *B81C 1/00309* (2013.01); *H04R 1/04* (2013.01);
(Continued)

(58) Field of Classification Search
CPC .............. H04R 19/04; H04R 2201/003; H04R 2499/11; H04R 19/005; H04R 1/342; H04R 1/04; H04R 31/006; B81B 7/0061; B81B 2201/0257; B81B 2207/012; B81C 1/00309
See application file for complete search history.

(56) References Cited

U.S. PATENT DOCUMENTS

2010/0128914 A1* 5/2010 Khenkin .............. H04R 31/006
381/361
2017/0347174 A1* 11/2017 Chandrasekaran .... H04R 19/04

FOREIGN PATENT DOCUMENTS

CN 204929255 U 12/2015
WO 2018001937 A1 1/2018

OTHER PUBLICATIONS

Examination Report under Section 18(3), UKIPO, Application No. GB1905929.4, dated Feb. 16, 2021.
(Continued)

*Primary Examiner* — Matthew A Eason
(74) *Attorney, Agent, or Firm* — Jackson Walker L.L.P.

(57) ABSTRACT

The application relates to a MEMS transducer package comprising:
a package substrate the package substrate comprising a substrate channel, the substrate channel comprising first and second channel portions,
wherein the first portion extends in a first direction between a first channel opening in a side surface of the substrate and a junction between the first and second channel portions,
and wherein the second portion extends in a second direction between said junction and a second channel opening at, or underlying, a substrate opening provided in an upper surface of the package substrate.

18 Claims, 16 Drawing Sheets

Figure 1A:
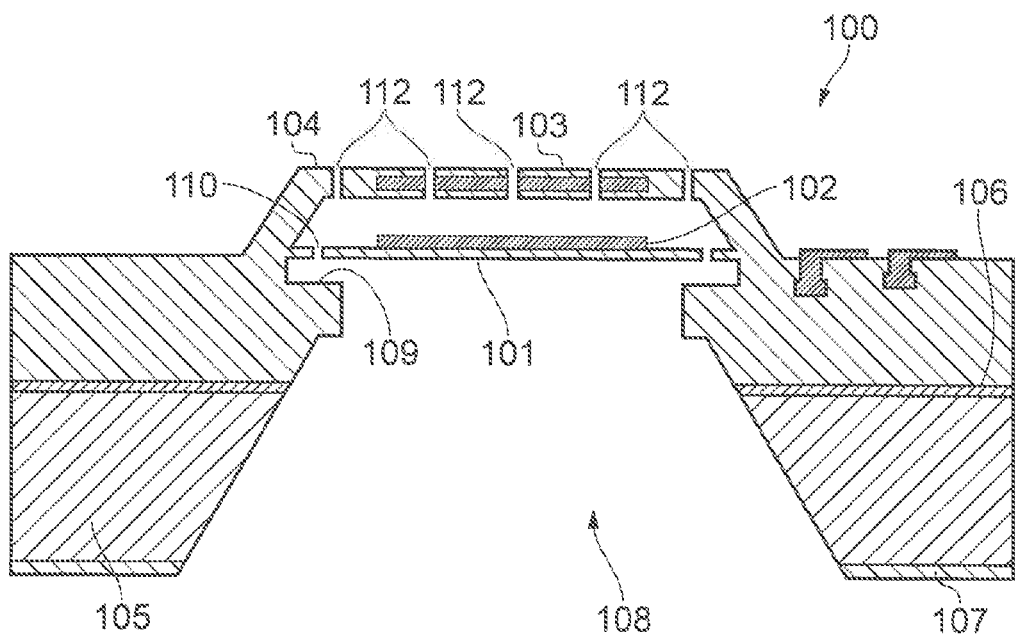

(51) Int. Cl.
*B81B 7/00* (2006.01)
*B81C 1/00* (2006.01)
*H04R 1/04* (2006.01)
*H04R 7/04* (2006.01)

(52) U.S. Cl.
CPC ........ *H04R 7/04* (2013.01); *B81B 2201/0257* (2013.01); *B81B 2207/012* (2013.01); *H04R 2201/003* (2013.01); *H04R 2499/11* (2013.01)

(56) References Cited

OTHER PUBLICATIONS

Combined Search and Examination Report under Sections 17 and 18(3), UKIPO, Application No. GB1905929.4, dated Sep. 26, 2019.

\* cited by examiner

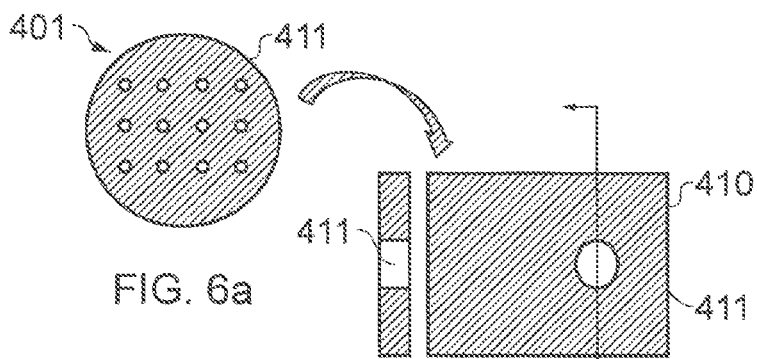
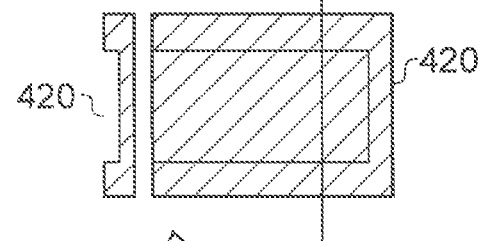
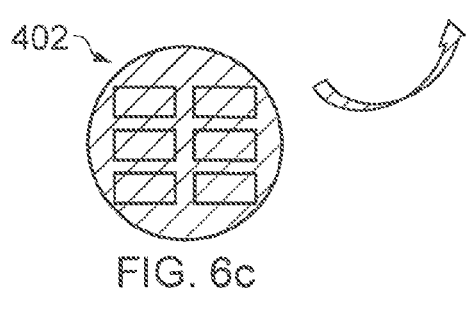
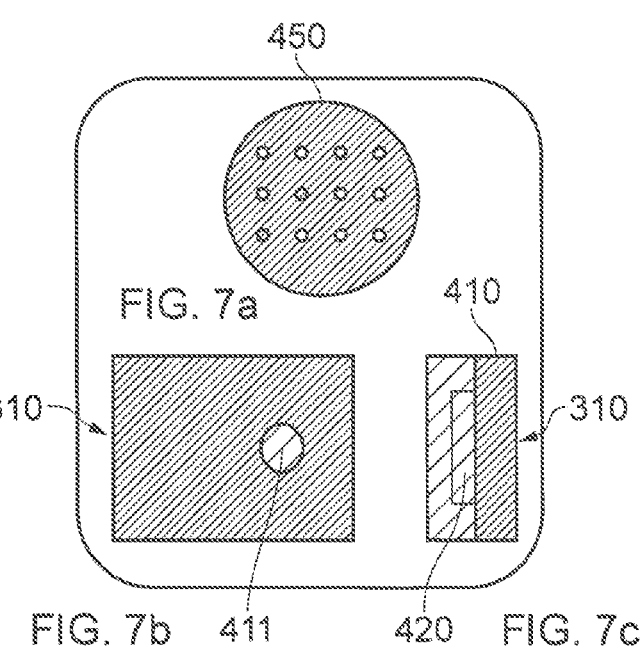

FIG. 9
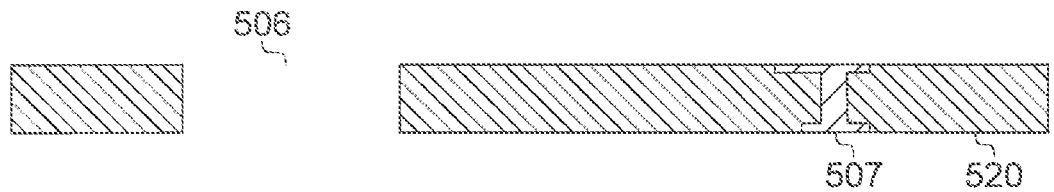
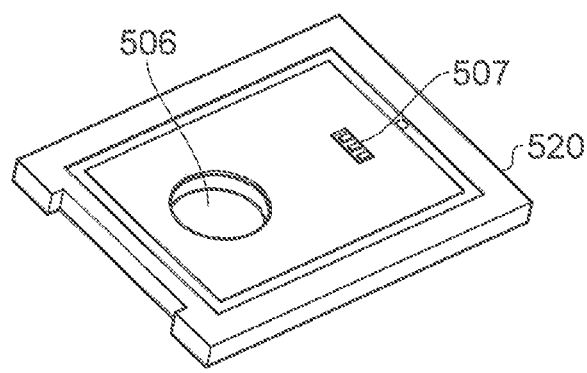
FIG. 9a
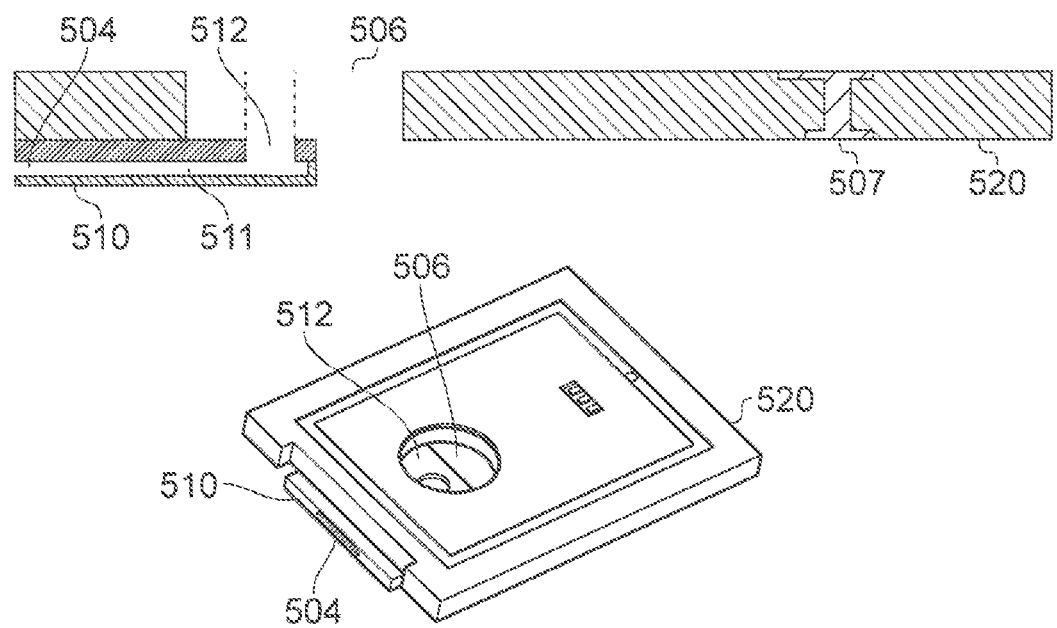
FIG. 9b

PACKAGING FOR A MEMS TRANSDUCER

TECHNICAL FIELD

This application relates to packaging for a micro-electro-mechanical system (MEMS) device and to processes for fabricating such packaging. In particular, this application relates to packaging for a MEMS capacitive microphone device and also to packaging processes.

BACKGROUND

MEMS devices are becoming increasingly popular. MEMS transducers, and especially MEMS capacitive microphones, are increasingly being used in portable electronic devices such as mobile telephones, headphones and other portable devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

A MEMS transducer will typically be housed within a package which allows easy handling and assembly and serves to protect the primary substrate and the component supported thereby from e.g. mechanical damage, RF noise and environmental contamination. The package also provides a means—e.g. an external conductive contact—for connecting the package to a circuit board or other elements.

Various packaging configurations are known. For example, a package for a MEMS transducer typically comprises a package substrate, which may be formed of a printed circuit board (PCB) or silicon, and a cover portion which extends in a plane overlying the upper surface of the package substrate supported by side walls. The cover portion and side walls may be provided by e.g. a metallic lid which is attached to the upper surface of the package substrate. Alternatively, the cover portion and the side walls may be formed of two further PCBs. The three PCBs are bonded together wherein the middle PCB comprises an opening which defines the chamber of the package. The MEMS transducer is attached to the upper surface of the package substrate within the chamber.

A package which houses a microphone transducer will typically have a sound port to allow transmission of sound waves to/from the transducer within the package. The transducer may be configured so that the flexible membrane is located between first and second volumes, i.e. spaces/cavities that may be filled with air (or some other gas suitable for transmission of acoustic waves), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one or more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials due to temperature changes or the like).

According to known package designs the sound port is provided in the cover portion of the package. In alternative known package designs the sound port is provided in the package substrate.

A packaged microphone transducer may be provided for use in a host device such as a mobile phone or other electronic device. Typically the package substrate is mounted and electrically connected to a host PCB or other substrate of the host device. It is typically necessary to mount a packaged microphone transducer close to a sound port formed in the outer boundary edge or cover of the host device in order to facilitate ingress of acoustic pressure waves (i.e. sound) into the front volume of the microphone transducer. Typically, a member providing a sound channel, e.g. a gasket, is typically interposed between sound port of the transducer package and the sound port provided in the device cover.

In many applications a packaged MEMS transducer will be mounted such that the sound port of the package is at least partially aligned with the acoustic port provided in the device cover. Thus, if the sound port of the package is projected in a direction normal to the sound port onto the plane of the device cover, then the boundary of the sound port will at least partly overlie the acoustic port provided in the device cover. Thus, any interposer member or gasket that provides a channel or conduit for fluid communication between the two sound ports may be generally longitudinal in form.

However, in some applications it may be necessary or advantageous for the MEMS transducer package to be mounted such that the sound port of the package is not aligned with the acoustic port of the device cover. In other words, there is a lateral offset between the acoustic port of the device cover and an orthogonal projection of the sound port of the transducer package onto the plane of the device cover. In this case, according to prior arrangements it has been proposed that a sound channel or gasket defining a more complex form is interposed between the sound port of the package and the sound port of the device. Thus, the sound channel may not define a straight line path between the two ports and may, for example, comprise one or more turns or bends in the path provided by the sound channel in order to direct and channel acoustic pressure waves between the ports.

In circumstances where the acoustic port of a microphone transducer package does not overly the acoustic port of the device cover when viewed in a direction normal to one of the ports, it will be appreciated that a more complex gasket design is required in order to direct or channel sound pressure waves between the two ports. Furthermore, the provision of one or more turning points or bends in the interposer member may render it more prone to folding and/or vulnerable to collapse.

The present examples are directed to the problem of channelling and/or directing acoustic pressure waves between the acoustic port of a device cover and the acoustic port of a microphone package, in particular in circumstances where the two ports are not aligned.

According to a first example of a first aspect there is provided a MEMS transducer package comprising:

a package substrate the package substrate comprising a substrate channel, the substrate channel comprising first and second channel portions, wherein the first portion extends in a first direction between a first channel opening in a side surface of the substrate and a junction between the first and second channel portions, and wherein the second portion extends in a second direction between said junction and a second channel opening at, or underlying, a substrate opening provided in an upper surface of the package substrate.

According to at least one example the substrate channel is provided by a channel member of the package substrate. The channel member may be formed of silicon or other semi-conducting material. According to at least one example the package substrate can be considered to be a composite substrate formed of PCB, a moulding material and the channel member.

According to at least one example a MEMS microphone transducer is provided on the upper surface of the substrate. The MEMS microphone transducer typically comprises a flexible membrane which deflects in response to a pressure differential across the membrane, and wherein the MEMS microphone transducer is provided such that the flexible membrane overlies the substrate opening in the upper surface of the substrate. A circuitry chip may also be provided on an upper surface of the substrate.

According to at least one example the MEMS transducer package may further comprise a lid portion, the lid portion being provided on the upper surface of the package substrate to define a chamber. The lid portion may be formed of metal.

According to at least one example of a second aspect there is provided a channel member comprising first and second channel portions, wherein the first portion extends in a first direction from between a first channel opening in a side surface of the channel member and a notional junction between the first and second channel portions, and wherein the second portion extends in a second direction between said notional junction and a second channel opening formed in an upper surface of the channel member.

The second portion may extend in a direction that is orthogonal or substantially orthogonal to the first direction. The channel member may be formed of silicon.

The channel member may comprise first and second layers, the first layer comprising a hole which extends through the first layer from an upper surface to a lower surface thereof, and the second layer comprises a recessed region formed in an upper surface thereof, wherein the upper surface of the second layer is bonded to the first layer and wherein the recessed region of the second layer defines the first portion of the channel member and the hole of the first layer defines the second portion of the channel member.

According to at least one example of a third aspect there is provided a wafer product comprising:

a first wafer comprising a plurality of first wafer portions, each first wafer portion comprising at least one hole which extends through the first wafer portion from an upper surface to a lower surface thereof;

a second wafer comprising a plurality of second wafer portions, each second wafer portion comprising a recessed region formed in an upper surface thereof, wherein the upper surface of the second wafer is bonded to the first wafer such that each first wafer portion substantially overlies a corresponding second wafer portion.

According to at least one example of a fourth aspect there is provided a composite package substrate comprising:

a main package portion comprising a cavity which extends through the main package portion from an upper surface to a lower surface thereof, a channel member mounted to the lower surface of the main package portion, the channel member comprising first and second channel portions, wherein the first portion extends in a first direction from between a first channel opening in a side surface of the channel member and a notional junction between the first and second channel portions, and wherein the second portion extends in a second direction between said notional junction and a second channel opening underlying said cavity.

According to at least one example of the further aspect the moulded layer defines a base layer of the composite package substrate. The moulded base layer may define a lower surface of the composite package substrate that is substantially flush with the lower surface of the channel member.

According to at least one example of a further aspect there is provided an electronic device comprising a MEMS transducer package according to the present examples. The device may comprises a cover, the cover being provided with a sound port and wherein the MEMS transducer package is mounted within the electronic device such that an orthogonal projection of the first channel opening of the substrate member coincides with sound port. The device may comprise at least one of: a portable device; a battery powered device; an audio device; a computing device; a communications device; a personal media player; a headphone, a mobile telephone; a games device; and a voice controlled device.

Associated methods of fabricating a MEMS transducer package, a channel member a package substrate and a wafer product are respectively provided for each of the aspects.

Figure 1B:
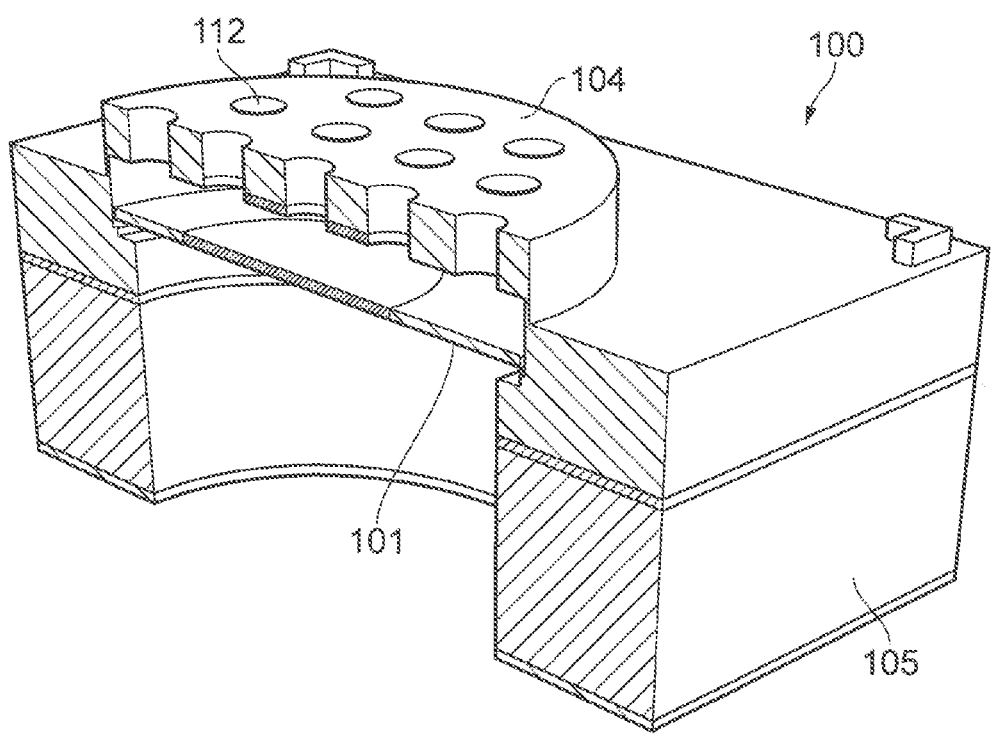
Figure 2A:
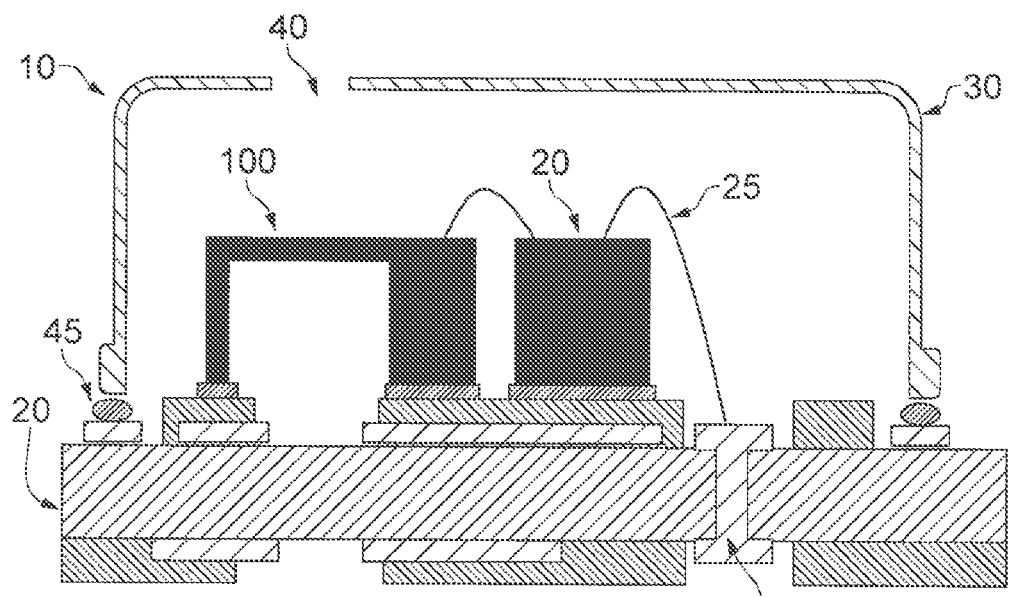
Figure 2B:
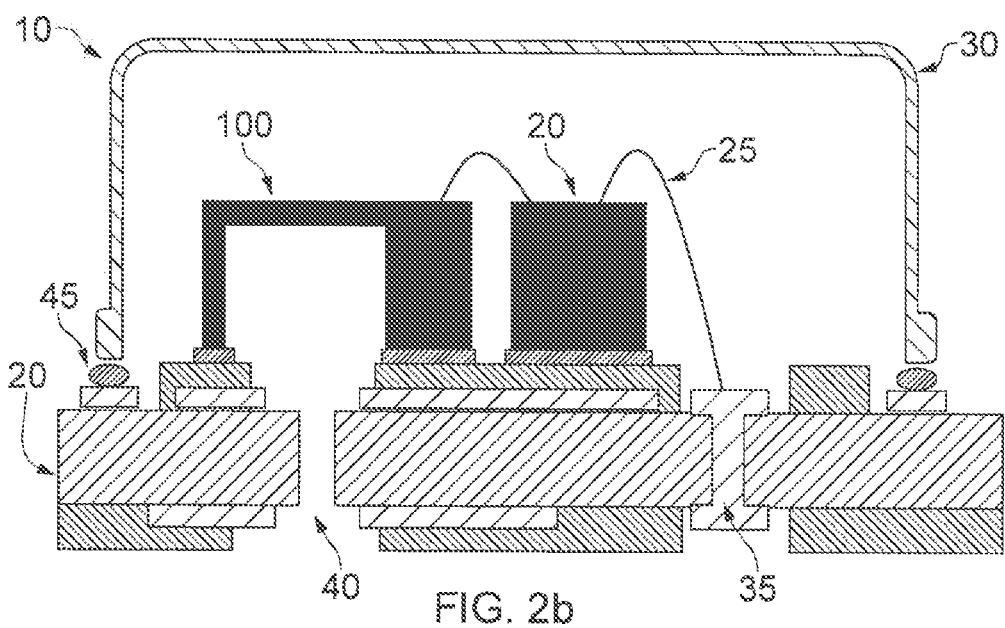
Figure 3A:
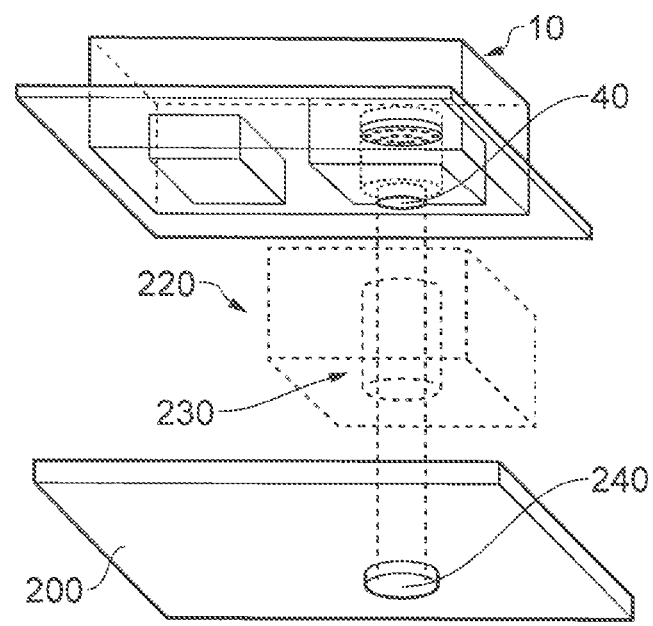
Figure 3B:
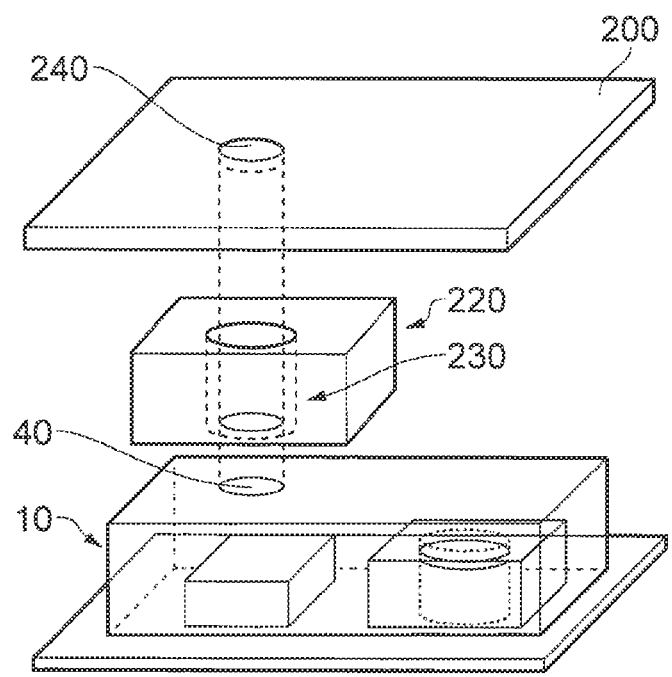
Figure 4:
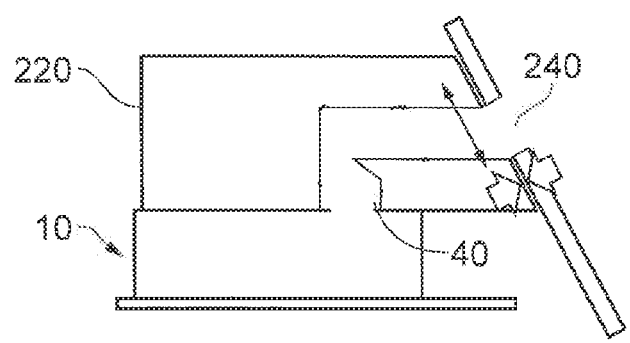
Figure 5A:
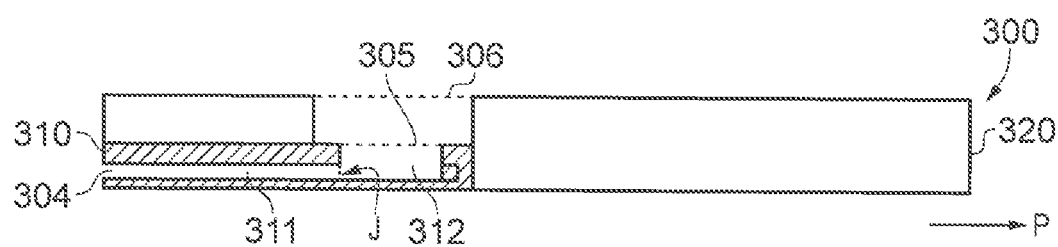
Figure 5B:
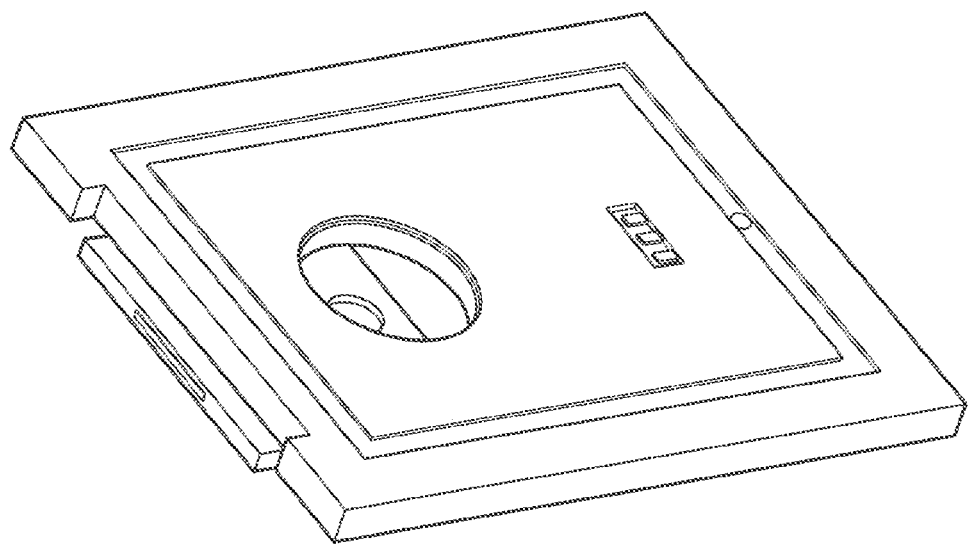
Figure 5C:
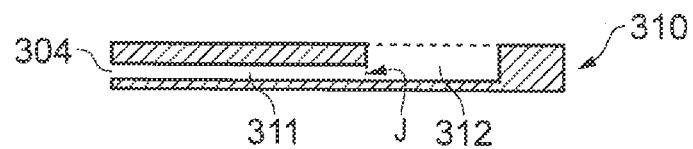
Figure 8:
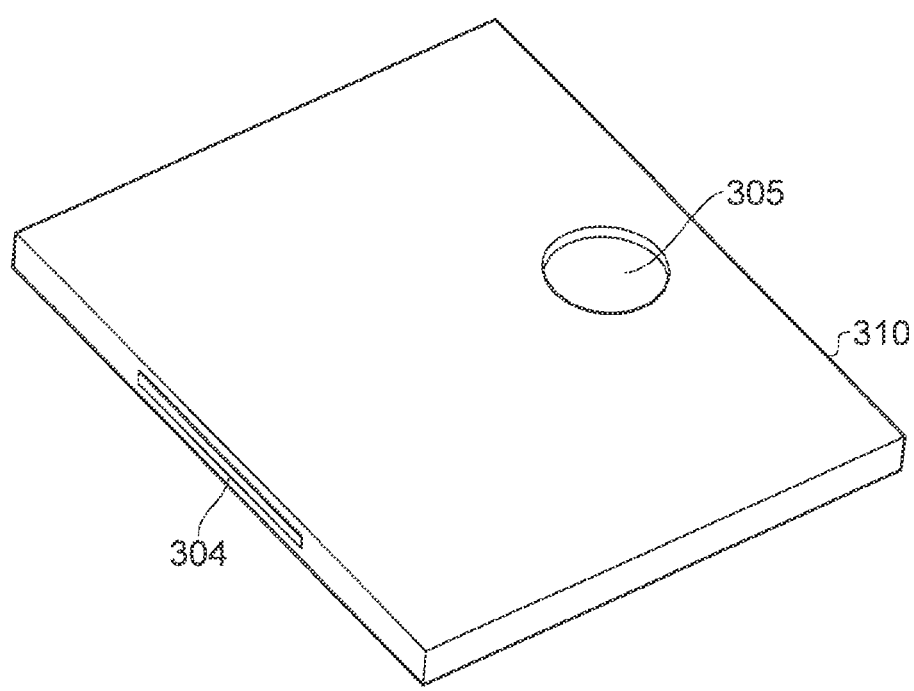
Figure 10A:
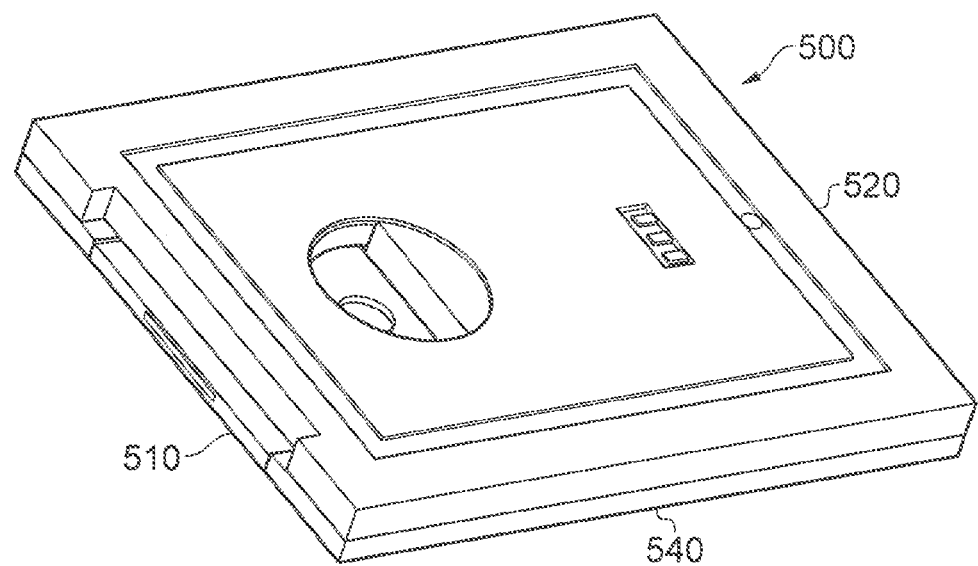
Figure 10B:
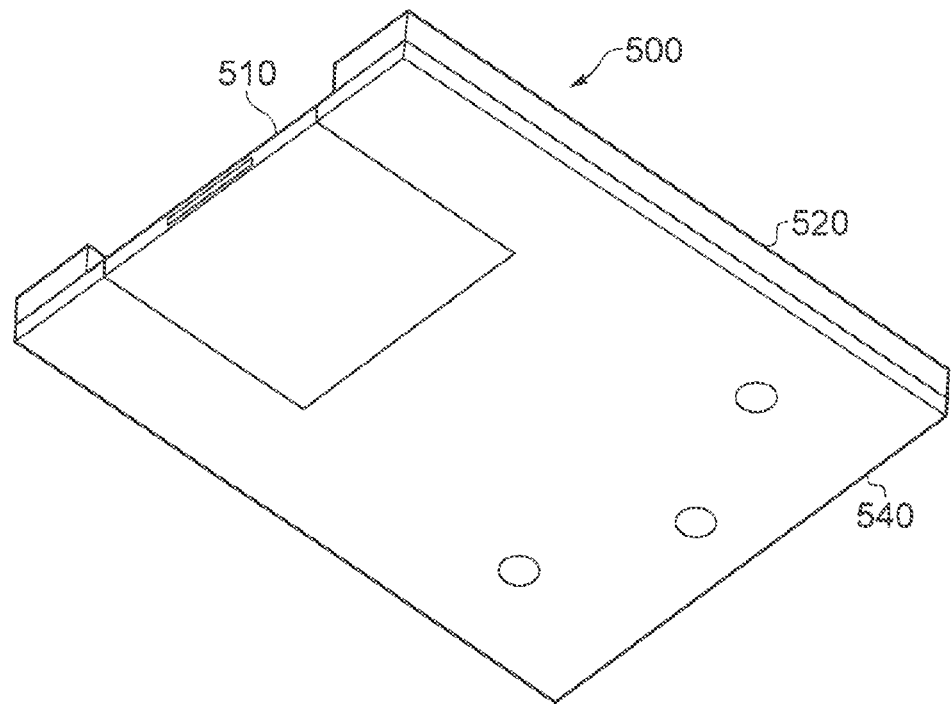
Figure 11:
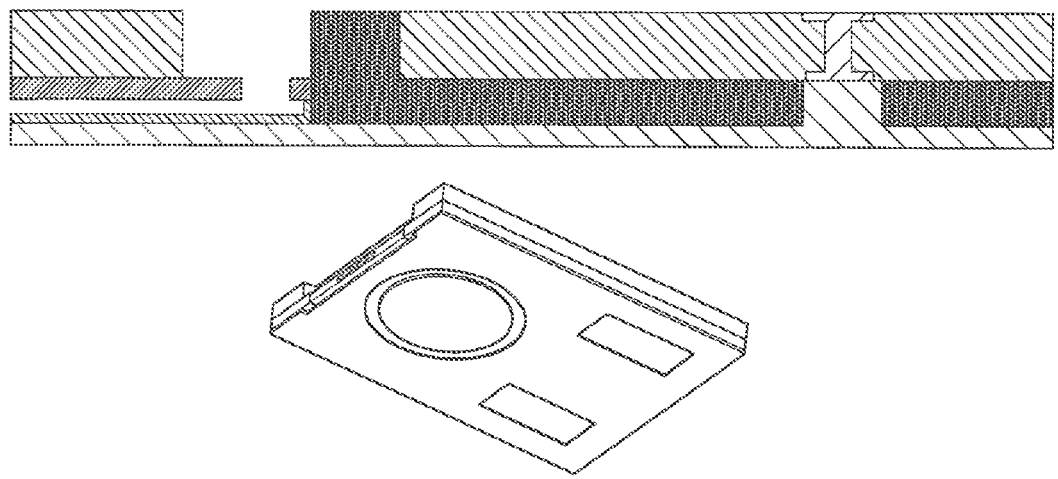
Figure 12A:
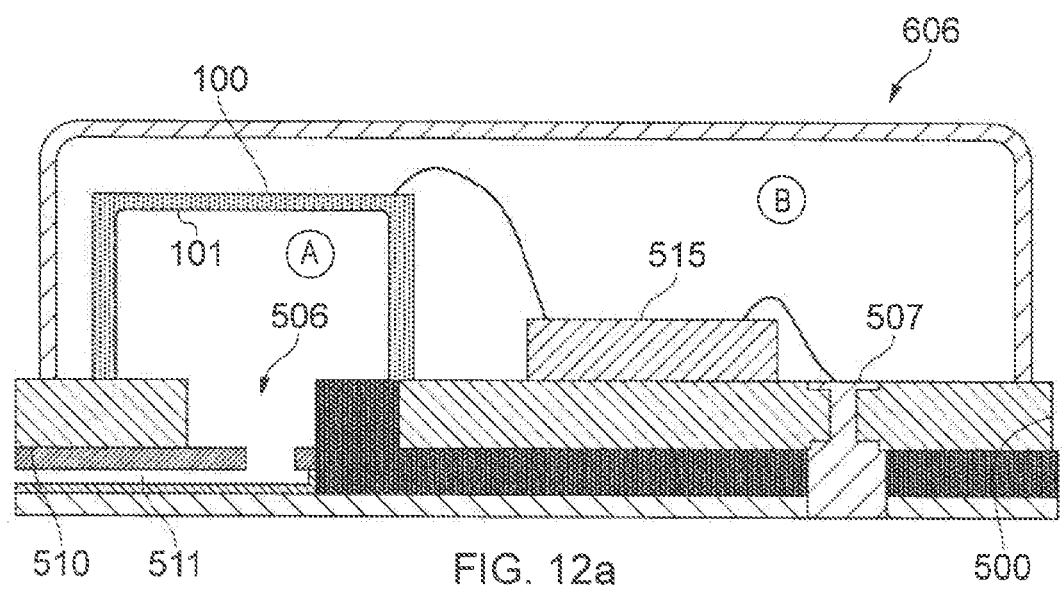
Figure 12B:
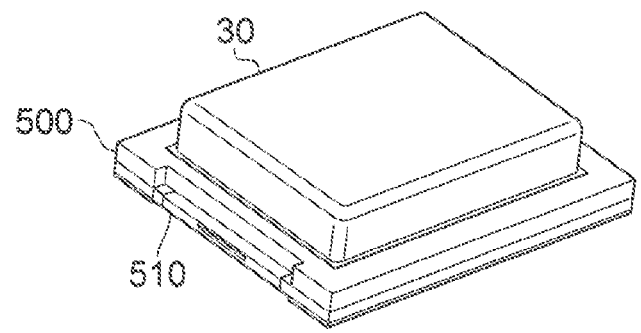
Figure 13:
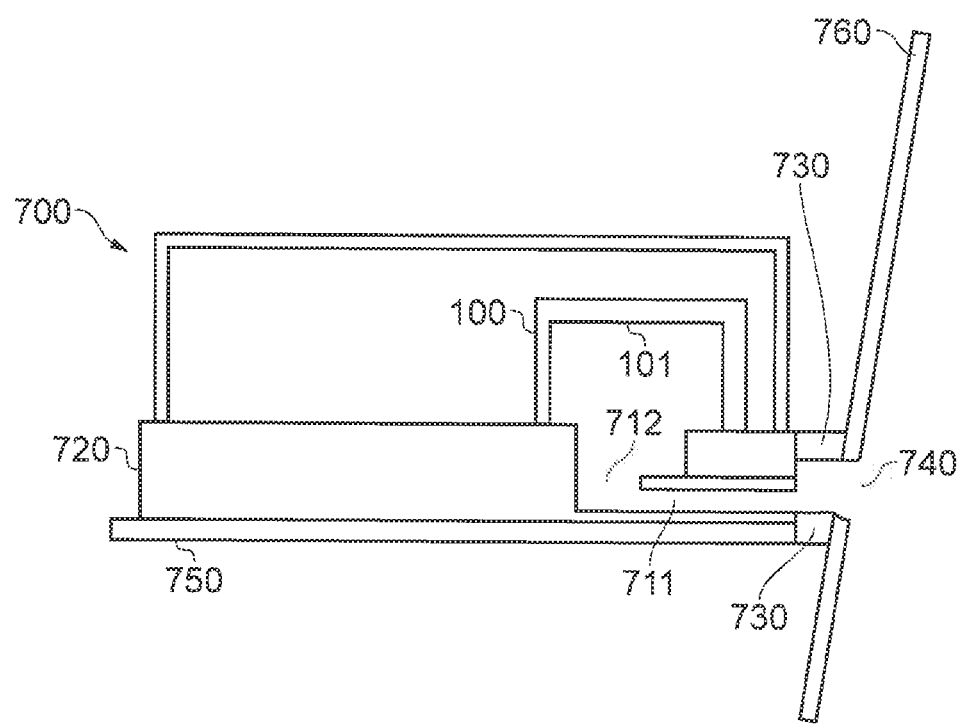
Figures 14A, 14B, 14C:
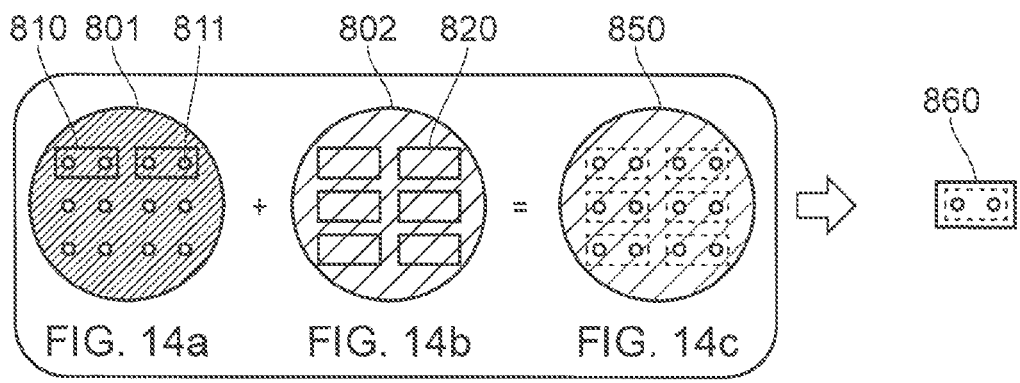
Figure 14D:
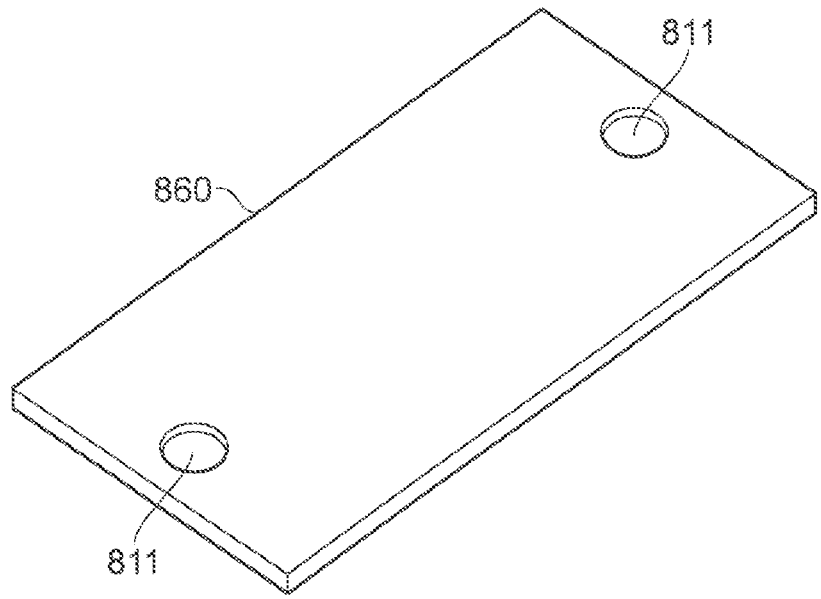

For a better understanding of the present invention, and to show how the same may be carried into effect, reference will now be made by way of example to the accompanying drawings in which:

FIGS. 1a and 1b, which may be collectively referred to as FIG. 1, show a schematic diagram and a perspective view, respectively, of a known capacitive MEMS microphone device;

FIGS. 2a and 2b, which may be collectively referred to as FIG. 2, illustrate previously proposed lid-type packages;

FIGS. 3a and 3b, which may be collectively referred to as FIG. 3, illustrate the relative alignment between a sound port of a microphone package and the sound port of a host device;

FIG. 4 illustrates a lack of alignment between a sound port of a microphone package and the sound port of a host device;

FIGS. 5a, 5b, and 5c, which may be collectively referred to as FIG. 5, illustrate a package substrate according to a first example;

FIGS. 6a, 6b, 6c, and 6d, which may be collectively referred to as FIG. 6, provide a schematic illustration of a first stage of method of manufacturing a channel member according to one example;

FIGS. 7a, 7b, and 7c, which may be collectively referred to as FIG. 7, provide a schematic illustration of a second stage of method of manufacturing a channel member according to one example;

FIG. 8 illustrates a perspective view of a channel member according to one example;

FIGS. 9a-9f, which may be collectively referred to as FIG. 9, illustrate a method of fabricating a package substrate according to one example;

FIGS. 10a and 10b, which may be collectively referred to as FIG. 10, illustrate a package substrate according to one example;

FIG. 11 illustrates a further processing stage which takes place on the package substrate shown in FIG. 10;

FIGS. 12a and 12b, which may be collectively referred to as FIG. 12, illustrate a transducer package according to one example;

FIG. 13 illustrates a transducer package mounted within a host device according to one example;

FIGS. 14a-14d, which may be collectively referred to as FIG. 14, illustrate the wafer-level fabrication of a pair of channel members, according to one example; and FIGS. 15a-15f, which may be collectively referred to as FIG. 15, illustrate a process of fabricating a plurality of transducer packages.

The description below sets forth examples and arrangements according to this disclosure. Further examples, arrangements and implementations will be apparent to those having ordinary skill in the art. Further, those having ordinary skill in the art will recognize that various equivalent techniques may be applied in lieu of, or in conjunction with, the examples discussed below, and all such equivalents should be deemed as being encompassed by the present disclosure.

The methods described herein can be implemented in a wide range of devices and systems including headphones, audio players, laptops, mobile phones, PDAs, hands-free sets, voice activated or voice-controlled devices and personal computers.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or backplate 104, which together form a second capacitive plate of the capacitive microphone device. In the example shown in FIG. 1a the second electrode 103 is embedded within the backplate 104 structure.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 112 are arranged in the backplate 104 so as to allow free movement of air molecules through the backplate, such that the second cavity 10 forms part of an acoustic volume with a space on the other side of the backplate. The membrane 101 is thus supported between two volumes, one volume comprising cavities 109 and substrate cavity 108 and another volume comprising cavity 110 and any space above the backplate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 104 forms part of the back-volume which is typically enclosed by some other structure, such as a suitable package.

It should also be noted that whilst FIGS. 1a and 1b shows the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

FIGS. 2a and 2b illustrate "lid-type" packages 10. A MEMS transducer 100 is mounted to an upper surface of a package substrate 20. The package substrate 20 may be PCB (printed circuit board) or any other suitable material. A cover or "lid" 30 is located over the transducer 100 and is attached to the upper surface of the package substrate 20 by means of e.g. epoxy resin or solder 45. The cover 30 may be a metallic lid. In FIG. 2a, a sound port 40 in the cover 30 provides a sound port and allows acoustic signals to enter the package. In FIG. 2b a sound part 40 in the substrate 20 provides the sound port and the MEMS transducer is mounted such that the flexible membrane of the transducer extends over the sound port. According to convention, the configuration shown in FIG. 2a—in which the sound port 40 is provided on opposite side of the package to the external electrical connection 35—is known as a "top port" configuration. The configuration shown in FIG. 2b—on which the sound port 40 is provided on the same side of the package to the external electrical connection 35—is known as a "bottom port" configuration. It will be appreciated that the terms "top port" and "bottom port" do not imply any particular orientation of the packaged device either during manufacture, processing or any subsequent application.

The package may also contain an integrated circuit 20. The integrated circuit will typically be formed on a die of semiconductor material and will be customised for a particular application. The integrated circuit will be electrically connected to electrodes of the transducer 100 and an electrically conductive path 25 will be provided between the integrated circuit and an electrical connection 35 provided on an external surface of the package. The integrated circuit may provide bias to the transducer and may buffer or amplify a signal from the transducer. It will be appreciated that according to an alternative arrangement (not shown) the integrated circuit may be provided as a monolithic device whereby the electronic circuitry is fully integrated within the same die as the microphone transducer.

FIG. 3 illustrates the relative arrangement between a sound port 40 of a microphone package 10 and the acoustic port 240 of the device cover 200 in circumstances where the sound ports can be considered to be aligned or mutually overlapping in the sense that the region of the ports will at least partially overlap when considering a perpendicular projection—indicated by dashed lines—of either one of the ports onto the plane of the other port. Specifically, FIG. 3a illustrates the relative alignment in the case of a bottom port microphone package whilst FIG. 3b illustrates the relative alignment in the case of a top port microphone package. An interposer member 220, or gasket, is provided between the port 40 of the package and the port 240 of the device cover. The interposer member provides a sealed longitudinal channel between the two ports allowing acoustic pressure waves that enter the sound port of the device to travel into the MEMS microphone package for detection.

FIG. 4 illustrates a prior arrangement in which there is no alignment between the sound port 40 of the microphone package and the sound port 240 of the device cover. Thus, a tortuous or non-straight path is defined between the two ports. In this case an interposer member 220 comprises a channel having first and second portions, wherein the second portion extends at an angle relative to the first portion. In other words, the channel defined by the interposer member 229 comprises a bend. A number of difficulties may arise in this arrangement. In particular, there is a risk of inadequate sealing pressure between the device cover and the interposer member. This potentially allows incoming pressure waves to leak around the gasket rather than progressing to the microphone package for detection. There is also a risk of the interposer becoming deformed and/or displaced with respect to its intended position. Furthermore, there is also a risk that the interposed may fold or collapse.

FIG. 5 illustrates a package substrate according to a first example. Specifically, FIG. 5a illustrates a cross-section through a package substrate 300 according to a first example. The package substrate 300 comprises a main substrate portion 320 which may be formed of e.g. a printed circuit board (PCB) or a semi conductive material such as silicon. The package substrate further comprises a substrate channel which is provided by a channel member 310. The substrate channel may be considered to comprise first 311 and second 312 channel portions which, for the purposes of illustration only, are differentiated by a dashed line which marks a notional junction J between the first and second channel portions. The first channel portion 311 extends in a first direction between a first channel opening 304 in a side surface of the channel member and the junction J. The second portion 312 extends in a second direction between said junction J and a second channel opening 305 which, for the purposes of illustration only is indicated by a dashed line. The first direction can be considered to be in plane with, or parallel to, the plane of the package substrate 300. The second direction can be considered to be orthogonal to the plane of the package substrate. If the substrate 300 is considered to define a horizontal plane, then the first direction can be considered to extend in a horizontal direction whilst the second direction can be considered to extend in a vertical direction. The second channel opening 305 underlies a substrate opening 306 provided in an upper surface of the main substrate portion and again indicated by a dashed line. FIG. 5b illustrates a perspective view of the package substrate 300.

Whilst the channel member 310 can be considered to form a part of the package substrate 300, it will be appreciated that the channel member 310 of this particular example may be fabricated separately and attached to the rest of the package substrate during a subsequent processing stage. The rest of the package substrate may comprise a printed circuit board (PCB) or may be formed of a semiconductor material such as silicon. The package substrate may be considered to be a composite package substrate consisting of a plurality of parts which make up the overall package substrate. The channel member 310 is independently illustrated in FIG. 5c. The channel member may be formed of a semiconductor material such as silicon. The channel member may, for example, be attached to the lower surface of a PCB substrate by means of an adhesive or glue.

Thus, according to at least one example of a second aspect there is provided a channel member which defines a channel for guiding acoustic pressure waves. The channel member is intended, in use, to be provided, in conjunction with one or more other components to form a composite package substrate.

FIG. 6 provides a schematic illustration of a first stage of a method of manufacturing a channel member according to one example.

As illustrated in FIG. 6a a first wafer 401 is provided. The first wafer 401 comprises a plurality of first wafer portions 410. An individual first wafer portion is illustrated in FIG. 6b. Each of the first wafer portions 410 is provided with a hole or aperture 411 which extends through the wafer material from an upper surface to a lower surface thereof.

As illustrated in FIG. 6c a second wafer 402 is also provided. The second wafer comprises a plurality of second wafer portions 420. Each of the second wafer portions are provided with a recessed region 422. An individual second wafer portion is illustrated in FIG. 6d. The recessed region comprises a region where the material of the wafer has been removed from a surface of the wafer. The recessed region 412 can be considered to intercept the boundary edge of the wafer portion.

During a subsequent processing stage illustrated by FIG. 7 the first wafer 401 is placed on top of the second wafer or vice versa such that the wafer portions 410 of the first wafer 401 are substantially aligned with the wafer portions 420 of the second wafer 402. The first and second wafers may be bonded together by a process of wafer to wafer bonding. Thus, an intermediate product 450 comprising a dual wafer layer structure wherein first and second wafers are bonded together is generated as illustrated in FIG. 7*a*.

The two-layer wafer structure 450 may then be diced or singulated stage to create a plurality of individual channel members 310 which are illustrated in top plan and side plan view in FIG. 7*b* and FIG. 7*c* respectively. Thus, a given recessed region 422 formed in a wafer portion 420 of the second wafer 402 in conjunction with a hole 411 formed in a wafer portions 410 of the first wafer 401 together define the substrate channel 311, 312.

FIG. 8 illustrates a perspective view of a channel member 310 according to a present example.

It will be appreciated that various other techniques may be employed to provide a substrate channel in a package substrate within the context of the present examples. For example first and second channel portions may instead be formed within the main portion of a package substrate.

A method of fabricating a MEMS transducer package substrate according to one example will now be described with reference to FIG. 9. It should be noted that, for ease, the referenced Figures show a single unit. However, in practice one or more of the present examples will advantageously involve the fabrication of multiple package substrates at one time, for example as an array or batch of units. It will also be appreciated that multiple intermediate products arise during the fabrication process and that the present examples extend to those intermediate products.

FIG. 9*a* provides a cross-sectional view as well as upper elevational views of a PCB 520 is provided. The PCB will form the main portion of the package substrate according to the present example. The PCB comprises a cavity which extends through the PCB from an substrate opening 506 in the upper surface thereof to an opening in the lower surface. At least one metal plated via 507 is also provided which facilitates electrical connections to be made from the region above the PCB 520 to the region below the PCB.

FIG. 9*b* shows the attachment of a channel member 510 to the lower surface of the PCB 520. Specifically, the channel member is located relative to the lower surface of the PCB 520 such that an opening 504 provided in a side edge of the channel member, and which represents one end of a first channel portion 511, is located at or near a side edge of the PCB 520. Furthermore, the channel member 510 is located such that the opening 505 which represents an opening to a second channel portion of the channel member 510 underlies the cavity 506 formed in the PCB 520. The channel member is secured relative to the PCB by means of an adhesive substance or glue.

Figure 9C:
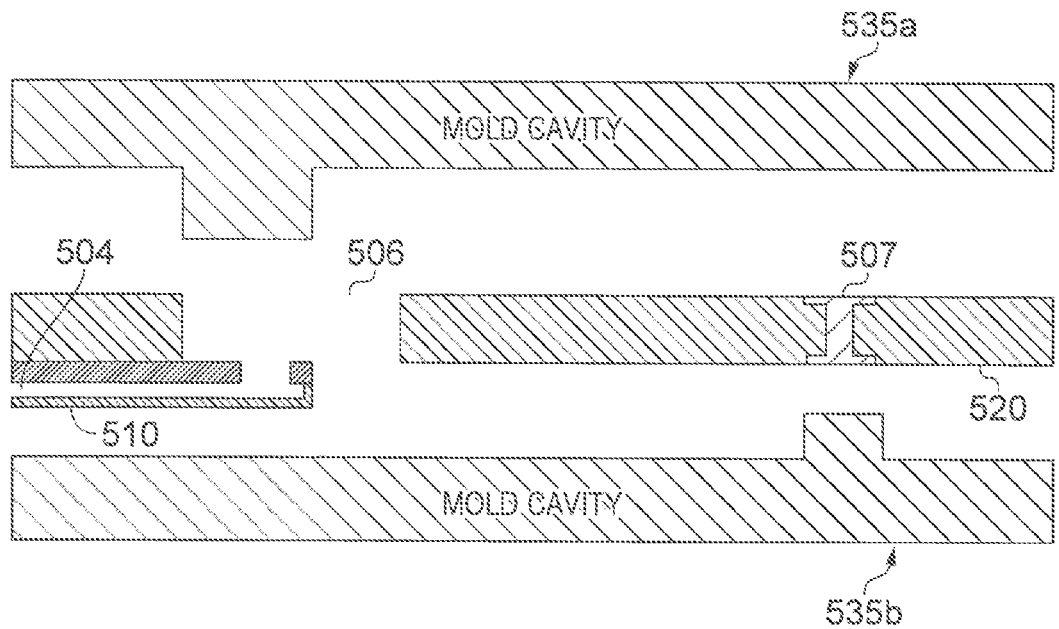
Figure 9D:
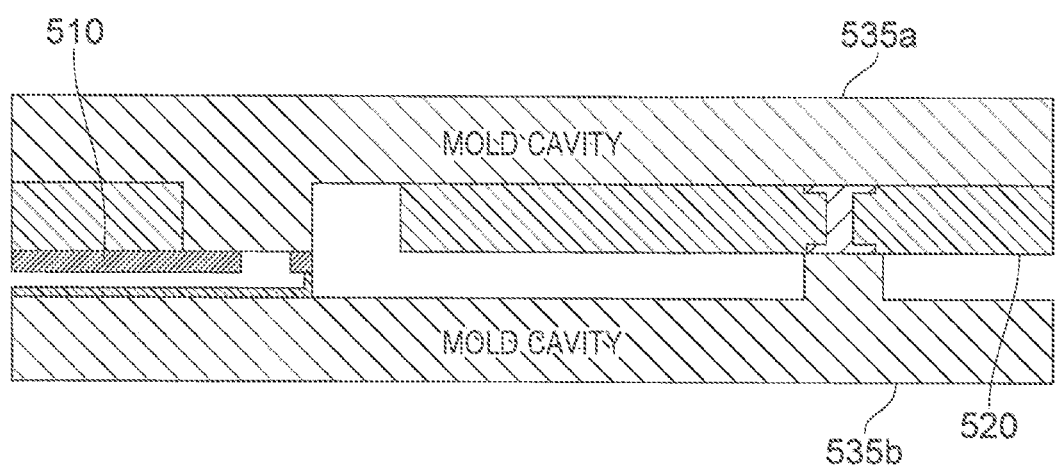

As illustrated in FIGS. 9*c* and 9*d*, a moulding tool 535 is applied relative to the upper and lower surfaces of the PCB 520 comprising the attached channel member 510. The moulding tool, which in this example comprises two components 535*a* and 535*b*, serves to fill a region where a moulding substance is not desired, and thus leaves a vacant region where a moulding substance is desired. The moulding component 535*a* includes a projection which extends into a portion of the cavity 506 provided in the PCB 520 that overlies the second opening formed in the upper surface of the channel member 510. This projection in the moulding component 535*a* serves to prevent the moulding substance from being placed into the cavity in the region directly above the second opening of the channel. The moulding component 535*b* includes a projection which contacts the lower surface of the PCB 520 in the region of the metal via, in order to prevent the moulding substance from being placed over the metal contact.

Figure 9E:
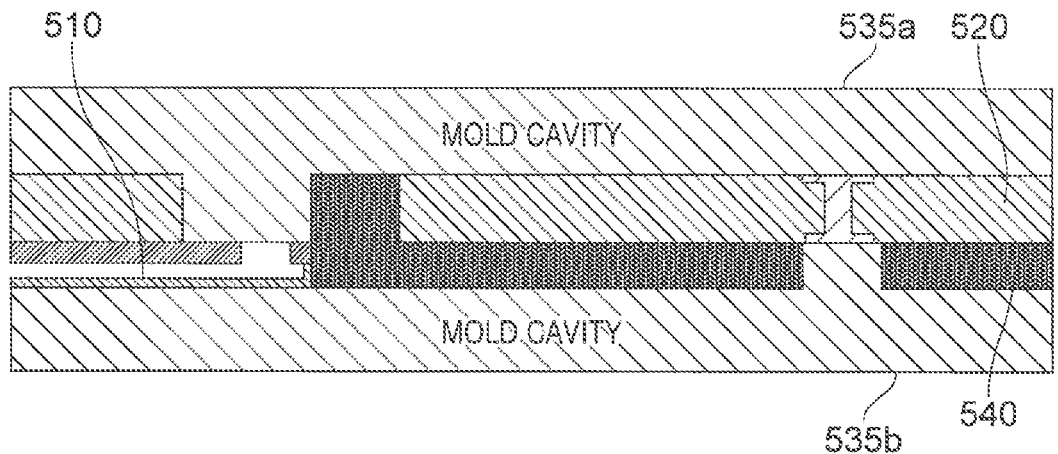
Figure 9F:
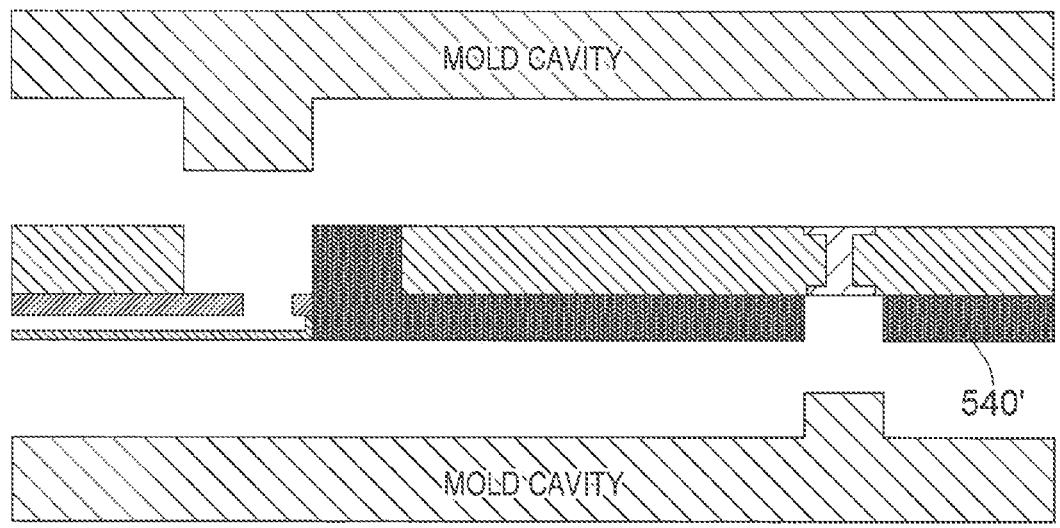

FIGS. 9*e* and 9*f* respectively show the application of a moulding substance 540, such as epoxy resin or epoxy moulding compound, to the vacant region defined by the moulding tool 535. The moulding substance is preferably a settable material which may be applied in liquid form and the allowed to harden or set in order to form a moulded base layer 540'. The setting of the moulding substance may be achieved or accelerated by a process of curing.

FIG. 10 illustrates a package substrate according to a further example. Specifically, FIGS. 10*a* and 10*b* respectively illustrate top and bottom perspective views of an example of a package substrate 500 according to a present example which may be fabricated by a method comprising the steps illustrated in FIGS. 9*a* to 9*f*. Thus, the package substrate 500 according to the present example comprises a PCB 520, a channel member 510 and a moulded base layer 540. In this example three metal contacts are provided on the underside of the package substrate—one for signal in, one for signal out and one for connection to ground.

Thus, the channel member 510 effectively provides a channel terminating in a side port which is formed integrally with the package substrate.

According to one or more examples and as shown in FIG. 11 a further processing step may involve the deposition of one or more layers such as redistribution layers to the upper or lower surface of the wafer. In particular, a copper plating process will take place to redistribute the 3 circular pads in FIG. 10*b* to usual pads complying with surface mounting process and standard mic footprint (GND ring and I/O pads) as seen in FIG. 11. The first insulator layer (such as solder mask) covers the copper redistribution layer and only leavers the pads area exposed.

FIG. 12 illustrates a transducer package according to one example. Thus, FIGS. 12*a* and 12*b* respectively illustrate a cross sectional view and perspective view of a transducer package 600 according to a further example. The transducer package comprises a composite package substrate 500 similar to the package substrate illustrated in FIGS. 10*a* and 10*b*. A MEMS microphone transducer 100 is mounted to an upper surface of the package substrate 500. The MEMS microphone transducer comprises a flexible membrane 101 which deflects in response to a pressure differential across the membrane. The MEMS microphone transducer is provided such that the flexible membrane overlies the substrate opening 506 in the upper surface of the package substrate.

The transducer package 600 further comprises an integrated circuit 515 provided on an upper surface of the substrate. The integrated circuit 515 is electrically connected to the MEMS transducer 100 and to the top of one of the metal contacts 507 provided in the upper surface of the package substrate.

A lid portion 30 is also provided which may comprise a metal lid. The lid portion 30 is mounted to the upper surface of the package substrate so as to enclose both the MEMS transducer 100 and the integrated circuit 515. Thus, the lid portion 30 defines a chamber. The region A in front of the membrane of the MEMS transducer 100 can be considered to be a front volume of the transducer, whilst the region B behind the membrane 101 can be considered to be the back volume.

It will be appreciated that the channel member 510 of the package substrate 600 provides a channel for directing acoustic pressure waves that is formed integrally with the composite package substrate. The entrance to the first channel portion 511 of the channel member 510 thus defines a sound port of the transducer package. This configuration may be usefully employed in circumstances where the transducer package is intended to be mounted in a host device and where the sound port of cover of the host device is provided outside—e.g. in a region to the side,—of a region directly below the cavity of the package substrate.

FIG. 13 illustrates a transducer package 700 mounted to a host substrate 750 of a host device. The transducer package comprises a package substrate 720 having a channel comprising first and second channel portions 711 and 712. The channel may be defined by a discrete channel member such that the package substrate can be considered to comprise a composite package substrate. A portion of the cover 760 of the device is illustrated, the cover comprising an acoustic port 740. Sound waves incident on the exterior of the host device and in the vicinity of the sound port 740 will enter the interior of the host device. A sealing member 730 which may comprise a single portion or multiple components is provided to ensure that the sound waves do not leak around the transducer package 700 but are instead channelled into the front volume of the MEMS transducer by the channel portions 711 and 712. The sealing member can be considered to be an interposer member or gasket.

There are a number of advantages associated with this arrangement wherein the sound port of the transducer package is located at a side surface of the package substrate. In particular, the need to provide a complex, e.g. non-longitudinal, interposer member between the sound port of the device cover and the sound port of the package is obviated. Instead, a simple interposer defining a longitudinal channel may be provided. The substrate channel thus provides an effective solution for channelling sound waves from a region laterally adjacent the package to the underside of the flexible membrane.

According to at least one example, rather than fabricating a channel member, which may be formed of a two-layer wafer structure similar to the channel member shown in FIG. 8, and attaching the channel member to a package substrate on an individual basis, it is envisaged that a pair of channel members may be fabricated as a single unit and attached to a wafer package as part of a batch.

The wafer-level fabrication of a pair of channel members is schematically illustrated in FIG. 14. Specifically, FIG. 14*a* illustrates a first wafer 801 is provided. The first wafer 801 comprises a plurality of wafer portions 810. Each of the wafer portions is provided with two holes or aperture 811 which extend through the wafer material from an upper surface to a lower surface thereof.

FIG. 14*b* illustrates a second wafer 802. The second wafer comprises a plurality of wafer portions 820 which are shaped and sized so as to correspond to the wafer portions 810 of the first wafer 801. Each of the wafer portions 820 are provided with a recessed region having a footprint which is larger than a region encompassing the two apertures 811 of each of the wafer portions 810. The recessed region comprises a region where the material of the wafer has been removed from an upper or lower surface of the wafer.

As illustrated in FIG. 14*c*, the first wafer 801 is placed on top of the second wafer 802 or vice versa such that the wafer portions 810 of the first wafer 801 are substantially aligned with the wafer portions 820 of the second wafer 802. The first and second wafers may be bonded together by a process of wafer to wafer bonding. Thus, an intermediate product 800 comprising a dual wafer layer structure wherein first and second wafers are bonded together is generated as illustrated in FIG. 14*c*.

The two-layer wafer structure 450 may then be diced or singulated stage to create a plurality of double channel members 860. A double channel member 860 is illustrated in FIG. 14*d*.

FIG. 15 illustrates a process of fabricating a plurality of transducer packages. As illustrated in FIG. 15*a*, a PCB comprising a plurality of PCB portions is provided, each PCB portion comprising a cavity 806 which extends through the PCB. A double channel member 860 is adhered to the underside of a PCB substrate such that a first aperture 811 of the double channel member underlies the cavity 806*a* of one PCB portion and a second aperture 811 of the double channel member underlies the cavity 806*b* of an adjacent PCB portion. As illustrated in FIG. 15*b* a moulding process takes place similar to the process illustrated in FIGS. 9*c* and 9*d* in order to define a composite package substrate portion. Multiple stages take place to arrive at the intermediate product illustrated in FIG. 15*c* which comprises a MEMS transducer (not shown) housed within a chamber defined by a lid portion 30 and positioned so as to overly the cavity.

Figure 15A:
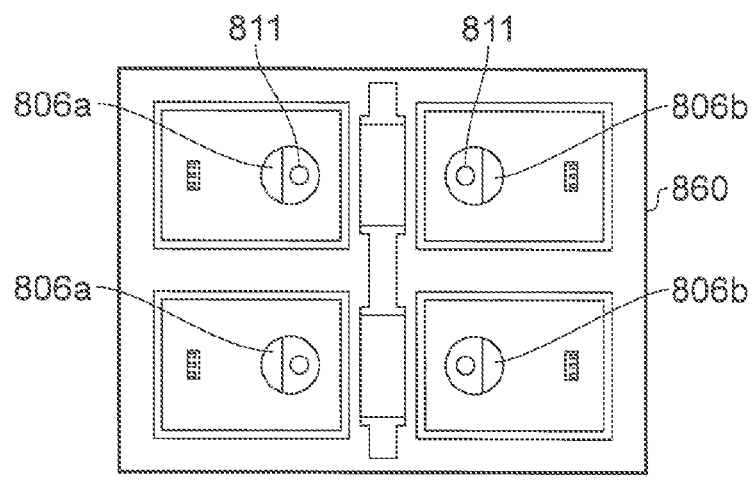
Figure 15B:
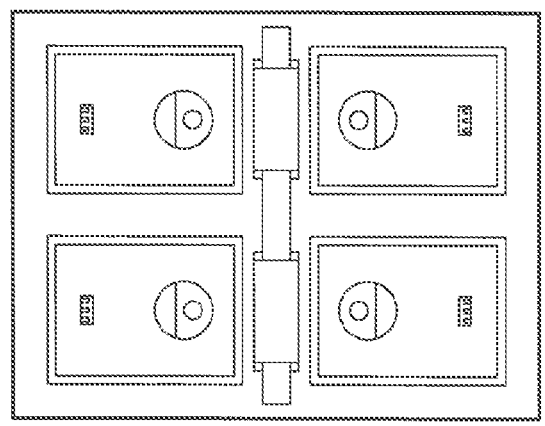
Figure 15C:
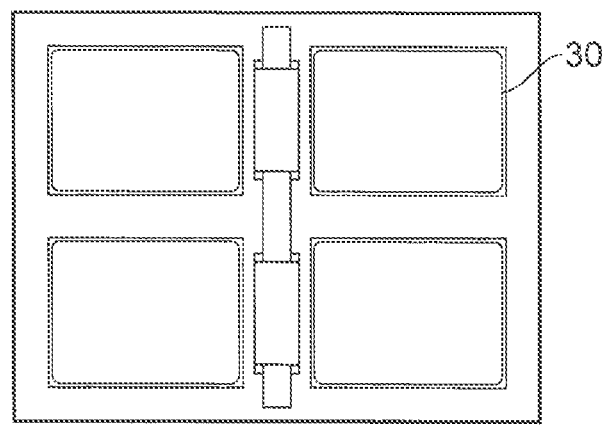
Figure 15D:
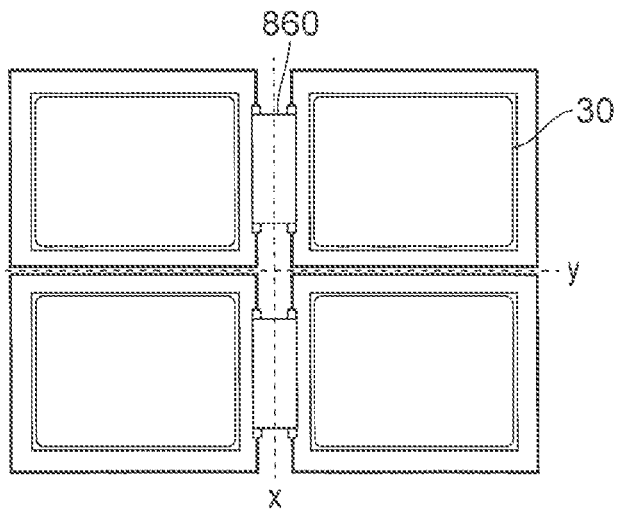

At FIG. 15*d* a step of separating the individual PCB portions takes place. This may involve a process known as PCB sawing along the line Y and along the line X. It can be seen that a pair of adjacent PCB portions are still connected by the double channel member 860.

Figure 15E:
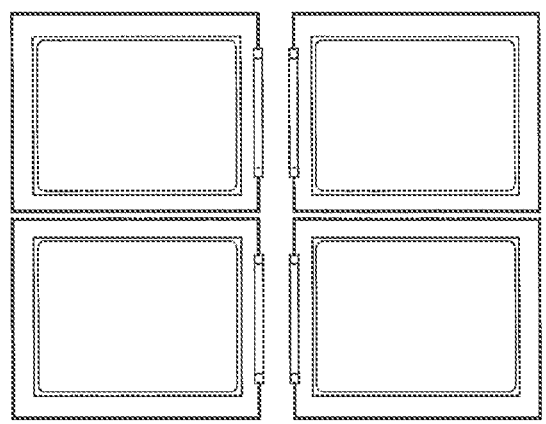
Figure 15F:
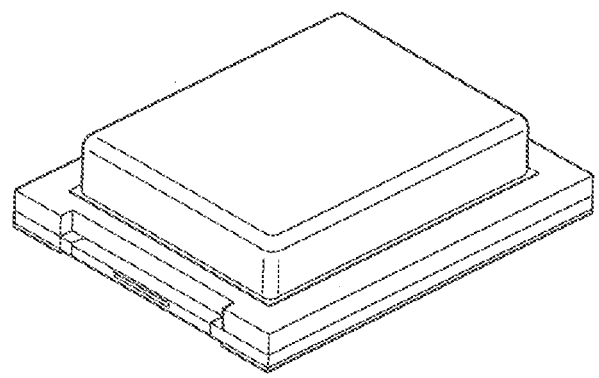

In a subsequent step, as illustrated by FIG. 15*e*, each pair of adjacent PCB portions are separated to form individual transducer packages as shown in FIG. 15*f*. Since the double channel member is formed of silicon, this may take place by a process known as silicon sawing or stealth dicing. Advantageously, therefore, the interior channel defined by the double channel is not exposed during the step of separating the individual PCB portions meaning that the interior channel remains free from debris that may be caused by the PCB sawing method. It is not until the subsequent step of silicon dicing, a relatively clean process, that the sound port and thus the channel of the resultant transducer package is exposed.

One or more MEMS transducers according to the examples described here may be located within a package. This package may have one or more sound ports. A MEMS transducer according to the examples described here may be located within a package together with a separate integrated circuit comprising readout circuitry which may comprise analogue and/or digital circuitry such as a low-noise amplifier, voltage reference and charge pump for providing higher-voltage bias, analogue-to-digital conversion or output digital interface or more complex analogue or digital signal processing.

It is noted that the example embodiments described above may be used in a range of devices, including, but not limited to: analogue microphones, digital microphones, pressure sensor or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer package, a channel member, a package substrate and a wafer product are respectively provided.

It should be understood that the various relative terms above, below, upper, lower, top, bottom, underside, overlying, underlying, beneath, etc. that are used in the present description should not be in any way construed as limiting to any particular orientation of the transducer during any fabrication step and/or its orientation in any package, or indeed the orientation of the package in any apparatus. Thus the relative terms shall be construed accordingly.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A MEMS transducer package comprising:
a package substrate, the package substrate comprising a channel member attached or secured to a surface of the package substrate providing a substrate channel, the substrate channel comprising first and second channel portions,
wherein the first portion extends in a first direction between a first channel opening in a side surface of the substrate and a junction between the first and second channel portions, and
wherein the second portion extends in a second direction between said junction and a second channel opening at, or underlying, a substrate opening provided in an upper surface of the package substrate.

2. A MEMS transducer package as claimed in claim 1, wherein the channel member is formed of silicon.

3. A MEMS transducer package as claimed in claim 1, wherein the package substrate is a composite substrate formed of PCB, a moulding material and the channel member.

4. A MEMS transducer package as claimed in claim 1, further comprising a MEMS microphone transducer provided on the upper surface of the substrate,
wherein the MEMS microphone transducer comprises a flexible membrane which deflects in response to a pressure differential across the membrane, and wherein the MEMS microphone transducer is provided such that the flexible membrane overlies the substrate opening in the upper surface of the substrate.

5. A MEMS transducer package as claimed in claim 1, further comprising circuitry provided on an upper surface of the substrate.

6. A MEMS transducer package as claimed in claim 1, further comprising a lid portion, the lid portion being provided on the upper surface of the package substrate to define a chamber.

7. A channel member for a MEMS transducer package, the channel member comprising first and second channel portions,
wherein the first portion extends in a first direction from between a first channel opening in a side surface of the channel member and a notional junction between the first and second channel portions, and wherein the second portion extends in a second direction between said notional junction and a second channel opening formed in an upper surface of the channel member, wherein the channel member is attachable to a surface of the MEMS transducer package to define a sound port for the transducer package.

8. A channel member as claimed in claim 7, wherein the second portion extends in a direction that is orthogonal or substantially orthogonal to the first direction.

9. A channel member as claimed in claim 7, wherein the channel member is formed of silicon.

10. A channel member as claimed in claim 7, wherein the channel member comprises first and second layers, the first layer comprising a hole which extends through the first layer from an upper surface to a lower surface thereof, and the second layer comprises a recessed region formed in an upper surface thereof, wherein the upper surface of the second layer is bonded to the first layer and wherein the recessed region of the second layer defines the first portion of the channel member and the hole of the first layer defines the second portion of the channel member.

11. A wafer product which is configured to, following dicing, create a channel member according to claim 7, the wafer product comprising:

a first wafer comprising a plurality of first wafer portions, each first wafer portion comprising at least one hole which extends through the first wafer portion from an upper surface to a lower surface thereof;

a second wafer comprising a plurality of second wafer portions, each second wafer portion comprising a recessed region formed in an upper surface thereof, wherein the upper surface of the second wafer is bonded to the first wafer such that each first wafer portion substantially overlies a corresponding second wafer portion.

12. A composite package substrate comprising:

a main package portion comprising a cavity which extends through the main package portion from an upper surface to a lower surface thereof, a channel member mounted to the lower surface of the main package portion, the channel member comprising first and second channel portions, wherein the first portion extends in a first direction from between a first channel opening in a side surface of the channel member and a notional junction between the first and second channel portions, and wherein the second portion extends in a second direction between said notional junction and a second channel opening underlying said cavity.

13. A composite package substrate as claimed in claim 12 wherein a moulded layer defines a base layer of the composite package substrate.

14. A composite package substrate as claimed in claim 13, wherein the moulded base layer defines a lower surface of the composite package substrate that is substantially flush with the lower surface of the channel member.

15. A composite package substrate as claimed in claim 14, wherein the moulded portion comprises a cavity portion which extends through a part of the cavity of the main package portion.

16. An electronic device comprising a MEMS transducer package as claimed in claim 1.

17. An electronic device as claimed in claim 16, wherein the device comprises a cover, the cover being provided with a sound port and wherein the MEMS transducer package is mounted within the electronic device such that an orthogonal projection of the first channel opening of the substrate member coincides with sound port.

18. An electronic device as claimed in claim 16, wherein the device is at least one of: a portable device; a battery powered device; an audio device; a computing device; a communications device; a personal media player; a headphone; a mobile telephone; a games device; and a voice controlled device.

* * * * *